(12) United States Patent
Turgis

(10) Patent No.: US 7,184,332 B2
(45) Date of Patent: Feb. 27, 2007

(54) MEMORY CIRCUIT AND METHOD FOR PROCESSING A CODE TO BE LOADED INTO A MEMORY CIRCUIT

(75) Inventor: David Turgis, Le Touvet (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/989,096

(22) Filed: Nov. 12, 2004

(65) Prior Publication Data

US 2005/0135138 A1   Jun. 23, 2005

(30) Foreign Application Priority Data

Nov. 14, 2003   (FR) .................................. 03 13354

(51) Int. Cl.
  G11C 17/00   (2006.01)
  G11C 7/10   (2006.01)
  G11C 7/00   (2006.01)
  G11C 29/00   (2006.01)

(52) U.S. Cl. ........................ 365/201; 714/718; 365/94; 365/189.05

(58) Field of Classification Search ................ 365/201, 365/94; 711/102
  See application file for complete search history.

(56) References Cited

U.S. PATENT DOCUMENTS 5,343,434 A * 8/1994 Noguchi ................. 365/185.04
5,426,609 A   6/1995 Okuda
5,787,033 A   7/1998 Maeno
6,292,868 B1   9/2001 Norman
6,363,001 B1 * 3/2002 Borot et al. ................. 365/104
6,563,745 B1   5/2003 Ilkbahar

OTHER PUBLICATIONS

Winegarden, S, "Bus Architecture of a system on a chip with user-configureable system logic" in IEEE Journal of Solid-State Circuits, Mar. 2000, vol. 35, Issue 3, pp. 425-433.*

* cited by examiner

Primary Examiner—Amir Zarabian
Assistant Examiner—Michael Weinberg
(74) Attorney, Agent, or Firm—Lisa K. Jorgenson; Stephen Bongini; Fleit, Kain, Gibbons, Gutman, Bongini, & Bianco P.L.

(57) ABSTRACT

A ROM-type memory is provided that includes a matrix of memory cells made up of rows and columns, with each row allowing storage of a page of MUX words of N bits. An address decoder decodes addresses in order to extract the page to be read. At the output of the matrix, N multiplexers are each coupled to the columns that correspond to one of the bits of the output stage. An N-bit output stage includes at least one inverter, with each of the inverters being connected to the output of one of the multiplexers so as to restore inverted values of information to be stored to correct values. The inverted values are stored in all of the memory cells of all of the columns coupled to the one multiplexer. Storing the inverted values makes it possible to store less "0" values within the matrix and further makes LVS testing of the ROM memory considerably easier. Also provided is a method for sequentially checking groups of memory cells.

7 Claims, 4 Drawing Sheets

MEMORY CIRCUIT AND METHOD FOR PROCESSING A CODE TO BE LOADED INTO A MEMORY CIRCUIT

CROSS-REFERENCE TO RELATED APPLICATIONS

This application is based upon and claims priority from French Patent Application No. 03 13354, filed Nov. 14, 2003, the entire disclosure of which is herein incorporated by reference.

FIELD OF THE INVENTION

The present invention relates to memory circuits, and in particular to a ROM-type memory circuit comprising a matrix of memory cells having rows and columns, with each row allowing storage of a page of MUX words of N bits.

BACKGROUND OF THE INVENTION

More and more electronic devices are equipped with semiconductor products including a microcomputer associated with an on board memory on the same semiconductor product, thus making up a real system on chip.

Increasing the power of such systems is done in particular by increasing the capacity of the Read Only Memories (ROM) that are used for storing the microprograms required to operate the integrated microcomputer.

However, increasing the capacity of ROMs poses serious problems for development teams.

For example, a first problem results from the increase in memory size that can currently reach 8, 16 or even 32 megabits, which makes memories extremely difficult to test with the traditional checking tools available to engineers. Indeed, a ROM is programmed by positioning a plate on the integrated circuit, with the plate comprising a set of contacts or vias for coding information to be stored in silicon.

FIG. 1 depicts the conventional operation of a memory cell or a memory point that comprises a transistor 1 serially connected with an element 2—a via or an open circuit—adapted to receive information to be coded. The unit is connected between ground (GND) and bit line 3 (BITLINE, that is in fact a column of the matrix), which line is in turn connected to the amplifiers (not shown) of the output stage of the memory.

Before any reading operation, the bit line is precharged to the supply voltage (Vdd). At the time of reading, address decoders (not shown) activate the gate of transistor 1 (carrying a signal WL or WORD LINE), making transistor 1 conductive and thus causing the bit line or column to be discharged when memory element 2 is a contact or a via. Such discharging is detected by a read amplifier (not shown) that thus outputs a logical "0". In the opposite case, if element 2 is an open circuit—corresponding to a logical "1"—the bit line cannot be discharged and the information is then detected by the output amplifier.

It should be noted that when the pages that are stored in the memory—namely the lines of the matrix network forming the memory—have a majority of logical "0" positioned on the same bit, usually the opposite value is stored in the memory points present on that bit line for all the pages in the memory and an inverter is arranged at the output of the bit line or column in order to restore the correct information value. In this manner, a reduced number of vias in the memory points corresponding to the same bit lines can be ensured, which has the advantage of reducing the leakage currents that tend to spontaneously discharge the bit line and that tend to progressively increase as the size of components decreases.

FIG. 2 illustrates an example of a traditional architecture of a ROM, which is a 4-bit memory, with a 4-bit multiplexing rate. The ROM is based on a matrix network 21 associated with an address decoder 22 and control logic 23 generating all clock signals and the like that are required for its operation. Matrix network 21 comprises a number of rows corresponding to the number of pages that can be stored in memory, and a number of columns (BITLINE) 27-1 to 27-4, 28-1 to 28-4, 29-1 to 294 and 30-1 to 30-4, with each column corresponding to a bit line. A read system comprises an output stage 24.

Conventionally, to program the memory, the density, Pi, of "0" values that must be stored in 27-1, 27-2, 27-3 and 27-4 is determined and, if this density is higher than 50%, the values stored in all these columns are inverted. The procedure is the same for columns 28-1, 28-2, 28-3 and 28-4 and an inverter is provided for restoring the correct value of the stored information if the values are inverted.

This known mechanism makes it possible to reduce the leakage currents within the bit lines or columns. It is, however, not satisfactory. Indeed, it tends to create a considerable tangle among the columns forming the matrix network and, consequently, makes checking thereof very difficult.

It is noted that the increase in the ROM size involves a corresponding increase in the size of the plate and eventually, one ends up having to position and test several million, or even several tens of million, contacts and vias on the memory in order to ensure the integrity of the microprogram stored in the memory.

Traditional checking techniques and systems, in particular the ones based on Layout Versus Schematics (LVS), very quickly prove unable to run low level testing on a ROM of such size. Indeed, as the structure of the code to check cannot be hierarchically organized, it is necessary to "point-by-point" check the entirety of the code, i.e., by checking each memory cell, whether it is associated with a via or a contact, or not. This amounts to coding and processing a file or database containing several million bytes, which greatly exceeds the capacities of conventional checking devices.

Thus, it is then necessary to invest in newer, more powerful and more expensive check and test tools that will in turn become obsolete and insufficient when the size of ROM increases again.

To this major difficulty is added a second problem that results from the fact that the storage of some programs can lead to a great disparity of pattern densities, thus leading to important gradients within the matrix. Such occurrence of gradients proves to be cumbersome especially with the increasing miniaturization of patterns and it is desirable to be able to reduce the value of these gradients.

Furthermore, the presence of inverters in some bit lines introduces a third problem linked to the considerable access time within the memory, which also needs to be reduced.

Therefore, there is a need to completely reconsider the design of read only memories intended to be integrated in a semiconductor product, in order to solve the above-mentioned problems.

SUMMARY OF THE INVENTION

One object of the present invention is to provide a structure of a read-only memory that remains easy to test even when the number of cells within the matrix increases.

Another object of the present invention is to provide a memory structure that allows integration of the memory structure within an integrated circuit and improves the gradient of vias within the memory structure.

A further object of the present invention is to provide a memory structure that has a constant access time whatever the bit line considered.

One embodiment of the present invention provides a ROM-type memory comprising a matrix of memory cells having rows and columns, with each row allowing storage of a page of MUX words of N bits. An address decoder decodes addresses in order to extract a page of MUX words to be read. Columns of the same rank are grouped and connected to a multiplexer from a set of N multiplexers, and the output of at least one multiplexer is associated with an inverter so as to allow the storage of the opposite value of information in all the memory cells belonging to a band of columns associated with this multiplexer.

A new organization of the memory results, with a grouping of the columns on the same MUX wide band, with the columns being clearly independent from one another.

The checking procedures then become directly applicable on these bands, independently from one another. Indeed it is now possible to carry out a complete check on a matrix network band, on a height identical to the height of the matrix and a width of MUX columns. Such checking can be carried out with traditional check and test tools (such as LVS), whatever the size of the memory.

Moreover, by grouping the inverters on several columns (within the same group of MUX columns) the distribution of contacts or vias introduced into the matrix is changed, so that the homogeneity of pattern density improves and so does the gradient of metal layers.

Preferably, the storage of the opposite value is carried out when the number of "0" values to be stored in the memory exceeds a predetermined threshold, so as to ensure a minimum leakage current. Contrary to the traditional technique, this prevents columns from discharging too much, while ensuring an average value taken on a MUX wide band instead of only one column.

In a preferred embodiment, non-inverter circuits symmetrical to inverter circuits are integrated into the bands that comprise no inverters. Thus a substantially equal access time to all columns is ensured and the behavior of the memory improves.

This results in similar performance at the output of all multiplexers, whether they are associated with inverters or not.

Preferably, transit times are reduced by inverters comprising a differential amplifier that allows the detection of a small variation in order to further reduce transit time.

Yet another object of the present invention is to provide a method in which there is provided a ROM-type memory circuit that includes a matrix of rows and columns of memory cells such that each row allows storage of a page of MUX words of N bits, an address decoder decoding addresses and determining which of the pages to read, an output stage comprising N bits, a set of N multiplexers that each have inputs coupled to the columns that correspond to one of the bits of the output stage, and at least one inverter. Each of the at least one inverters is connected to the output of one of the multiplexers so as to restore inverted values of the information to be stored to correct values, and the inverted values are stored in all of the memory cells of all of the columns coupled to the one multiplexer. In this method, groups of memory cells are sequentially checked, with each group of memory cells being associated with one of the multiplexers.

Other objects, features and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 3:
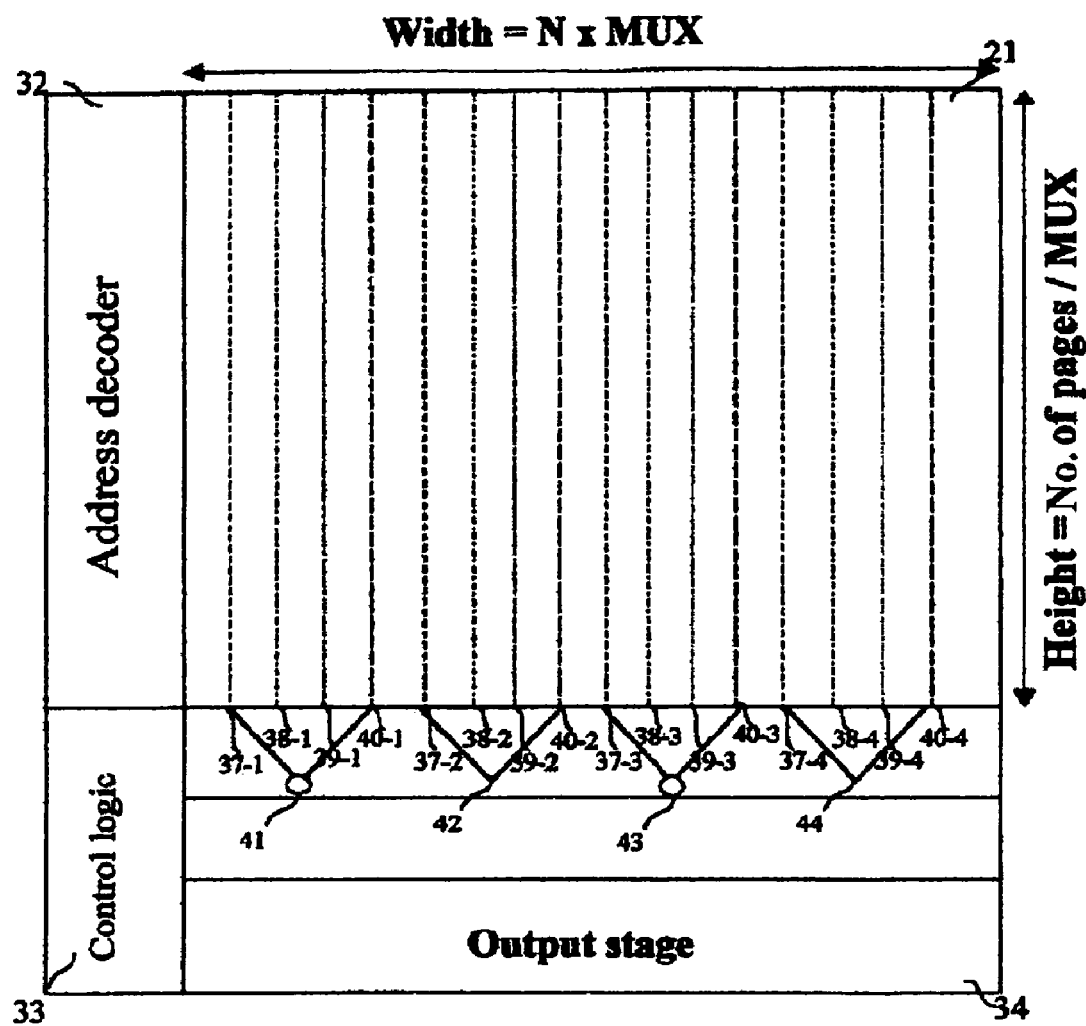
FIG. 3 illustrates the structure of a ROM memory according to a preferred embodiment of the present invention.

FIG. 3 illustrates a preferred embodiment of the present invention. There is shown a structure of a read-only memory in matrix form, which is made up of a number of rows forming as many pages, with each page consisting of four words of four bits each. These values are not meant to be limiting but have been selected for the sake of simplification only, and those skilled in the art can easily adapt the structure to any memory characteristic.

The memory comprises a matrix 31 organized in rows (WORDLINE) and columns (BITLINE) like a traditional ROM memory.

Generally, when designing an on board memory, such memory is defined by the number of rows it comprises, corresponding to the number of pages that can be accessed, by a multiplexing rate (MUX), corresponding to the number of words contained in each page, and by a number of bits, N, for each word.

The multiplexing factor makes it possible to reduce the number of rows and, correlatively, to increase the number of bits for each line. Generally, the following relationships are found.

Number of rows of the matrix=Number of Words/ MUX

Number of columns of the matrix=N×MUX

An address decoder 32 is used to decode addresses and to determine a particular memory page to be read. Control logic 33 makes it possible to generate the required control signals and clock signals, and the memory provides n-bit words via an output stage 34.

Figure 1:
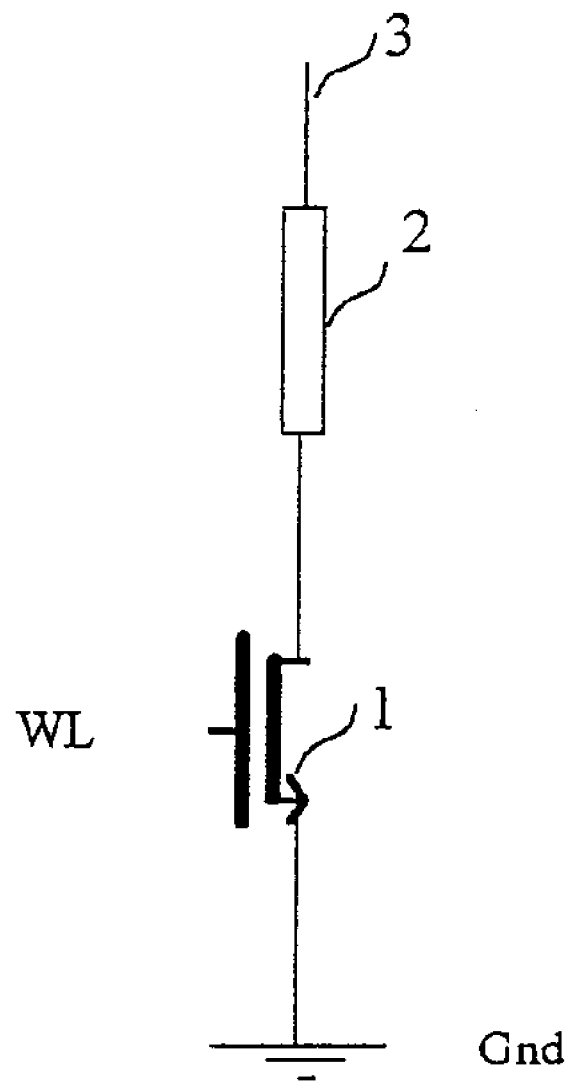
FIG. 1 illustrates a conventional memory cell of a ROM memory.
Figure 2:
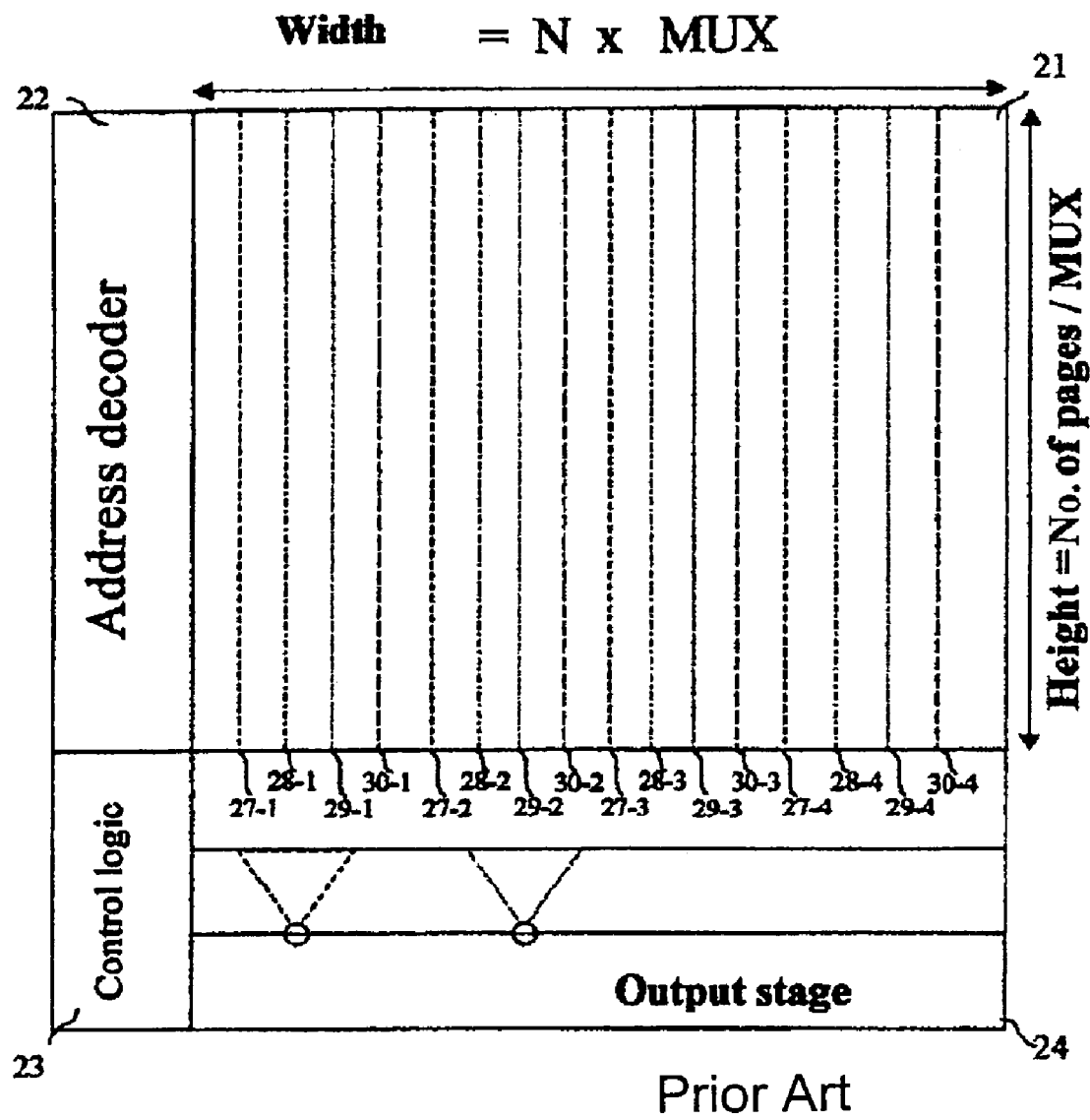
FIG. 2 illustrates the structure of a conventional ROM memory.

For the sake of simplification and to highlight the difference between this structure and the traditional structure of FIG. 2, a memory structure having the same characteristics as that of FIG. 2, namely a 4-bit output and a multiplexing rate equal to 4, has been illustrated.

Thus, at the output of columns (BITLINE) 37-1 to 37-4, 38-1 to 38-4, 39-1 to 39-4 and 40-1 to 40-4, are the multiplexer stages 41, 42, 43 and 44 corresponding respectively to bit 1, 2, 3 and 4 of the output stage.

Contrary to the traditional structure, the memory according to the preferred embodiment of the present invention groups together columns (BITLINE) corresponding to the same multiplexer in MUX-wide bands.

The density of "0" values in this group of MUX adjacent columns (n=MUX) is computed and, if necessary, all of the columns are inverted. The columns being connected to the inputs of a single multiplexer, an inverter only need be provided at the output of the multiplexers—for example multiplexers 41 and 43 shown in FIG. 3—to restore correct information.

Thus, the present invention contrasts sharply with the traditional technique based on calculating the density of "0" values on a group of n columns that are not adjacent (as opposed to the grouping of adjacent columns in the present invention) but spaced by MUX and thus involving several multiplexers. This tangles up the various columns and, consequently, creates the difficulty in testing the whole memory.

This feature of the present invention makes the circuit considerably easier to design. This feature also allows the physical network to be clearly separated in a set of N distinct groups that can be tested separately. That is, there can be performed sequential checking of groups of cells belonging to the same multiplexer. The checking procedures become directly applicable on these MUX-wide bands, independently from one another. Indeed it is now possible to carry out a complete check on a matrix network band, on a height identical to the height of the matrix (i.e., the number of rows) and a width of MUX columns. Such checking can be carried out with traditional check and test tools (such as LVS), whatever the size of the memory.

This allows the size of ROM memories to be limitlessly increased while ensuring simple and not too expensive testing thereof.

Preferably, an inverter is inserted when the rate of "0" values to be stored in cells corresponding to a single band exceeds 50%. This allows a reduction in leakage currents that could cause a column (BITLINE) to discharge.

Moreover, the distribution of contacts and vias having to be stored in memory can also be modified, consequently acting on the value of the gradient within the matrix.

In a preferred embodiment, the multiplexers that are not associated with an inverter, such as multiplexers 42 and 44 in FIG. 3, are associated with a read circuit comprising a buffer having substantially the same transit time as the inverter circuit.

One thus ensures uniformity regarding information transit time at the output of the memory.

Additionally, in preferred embodiments each inverter is realized by a differential amplifier comprising a first input connected to a reference voltage and a second input connected to the output of the multiplexer. So, the differential amplifier makes it possible to very quickly detect a small variation $\Delta v$ in the voltage of the bit line and thus can interpret more quickly the data to extract. This further improves transit time.

Figure 4:
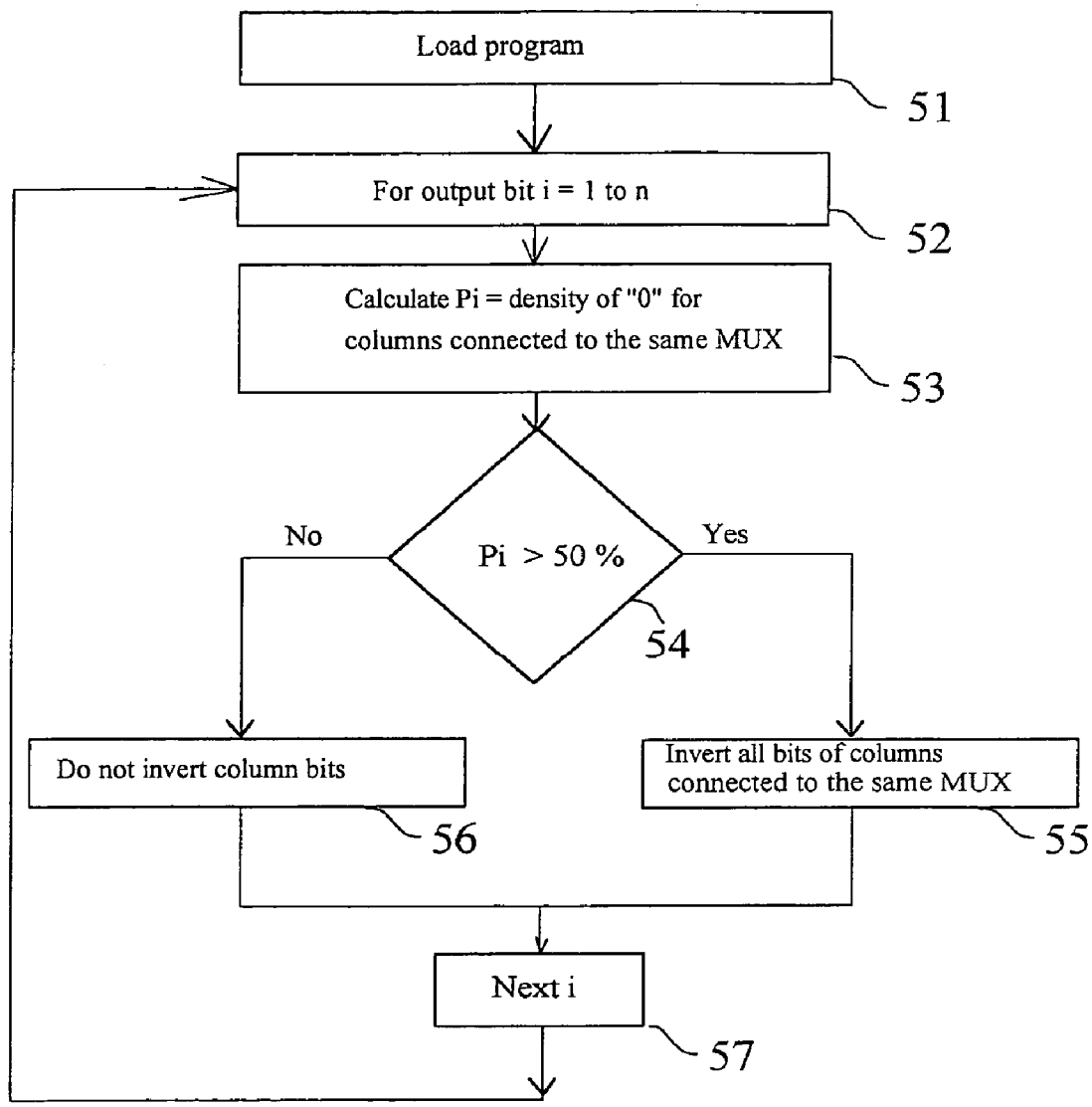
FIG. 4 illustrates a method for processing a code to be stored in a memory structure in accordance with one embodiment of the present invention.

To allow the programming code to be loaded in the memory architecture of the present invention, the code is preferably subjected to specific processing as described in relation to FIG. 4. Such processing aims at dividing the code into sections that can be independently stored in MUX-wide bands within the silicon.

The processing method comprises the following steps.

At step 51, the programming code is loaded in a computer memory where it will be processed.

At step 52, a loop process is initialized with a counter i=1 to n, corresponding to each one of the n bits on the output bus.

At step 53, the number of "0" values stored within a single output bit, i, is computed for all the MUX columns (BITLINE) corresponding to this bit, i.

Step 54 corresponds to a test. If the computed value is greater than a predetermined threshold—preferably 50 percent—then the process goes to step 55 where each one of the bits corresponding to the MUX columns (BITLINE) is inverted.

In the contrary case, if the test at step 54 fails, then the process continues with step 56 where the stored values remain unchanged.

At step 57, counter i is incremented and, if necessary, the loop formed by steps 53–57 is reiterated, until processing of all the columns of the matrix is completed.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method for testing memory circuit, said method comprising:
    providing a ROM-type memory circuit that includes:
        a matrix of memory cells for receiving data, the matrix being made up of rows and columns, each row allowing storage of a page of MUX words of N bits;
        an address decoder coupled to the matrix, the address decoder decoding addresses and determining which of the page to read;
        a set of N multiplexers coupled to the matrix and the output stage, each of the multiplexers having its inputs coupled to the columns that correspond to one of the bits of the output stage; and
        at least one inverter, each of the at least one inverters being connected to the output of a different one of the multiplexers for restoring inverted values of information to be stored to correct values, the inverted values being stored in all of the memory cells of all of the columns coupled to at least one of the multiplexers, each of the multiplexers not having one of the inverters connected to its output having a buffer connected to its output, the buffer having substantially the same transit time as the inverters; and
    successively testing groups of the memory cells associated with a same one of the multiplexers.

2. The method according to claim 1, wherein in the memory circuit, the memory cells of all of the columns coupled to a first of the N multiplexers contain or do not contain the inverted values of the information to be stored, based on the number of "0" values in the information to be stored in those memory cells.

3. The method according to claim 1, wherein in the memory circuit, the memory cells of all of the columns coupled to a first of the N multiplexers contain the inverted values of the information to be stored in order to reduce the leakage current within those columns.

4. The method according to claim 1, wherein in the memory circuit, the memory cells of all of the columns coupled to a first of the N multiplexers contain the inverted values of the information to be stored when the density of "0" values in the information to be stored within those memory cells exceeds a threshold.

5. The method according to claim 4, wherein the threshold is 50 percent.

6. The method according to claim 1, wherein each of the at least one inverters is realized by a differential amplifier.

7. The method according to claim 1, wherein the successively testing step comprises sequentially and separately checking N distinct groups of the memory cells.

* * * * *